United States Patent
Kondo

(10) Patent No.: US 8,634,870 B2
(45) Date of Patent: Jan. 21, 2014

(54) PORTABLE COMMUNICATION TERMINAL, AND POWER AMPLIFICATION CONTROL METHOD AND PROGRAM

(75) Inventor: Katsuhiro Kondo, Osaka (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 13/445,559

(22) Filed: Apr. 12, 2012

(65) Prior Publication Data

US 2012/0264383 A1 Oct. 18, 2012

(30) Foreign Application Priority Data

Apr. 12, 2011 (JP) ................... 2011-088536

(51) Int. Cl.
*H04M 1/00* (2006.01)
*H04B 1/04* (2006.01)
*H01Q 11/12* (2006.01)

(52) U.S. Cl.
USPC .............. 455/552.1; 455/103; 455/127.3

(58) Field of Classification Search
USPC ............ 455/552.1, 103, 127.1, 127.2, 127.3, 455/127.4
See application file for complete search history.

(56) References Cited

U.S. PATENT DOCUMENTS

| | | | | |
|---|---|---|---|---|
| 5,487,185 A | * | 1/1996 | Halonen | ................... 455/561 |
| 5,774,797 A | | 6/1998 | Kawano et al. | |
| 2005/0288052 A1 | * | 12/2005 | Carter et al. | ................. 455/522 |

FOREIGN PATENT DOCUMENTS

JP 08-204587 A 8/1996

* cited by examiner

*Primary Examiner* — Nguyen Vo
(74) *Attorney, Agent, or Firm* — Studebaker & Brackett PC

(57) ABSTRACT

A portable communication terminal comprising: a first amplifier; a second amplifier; and a control unit configured to perform a first control, in which the first amplifier is amplified within a range of a first upper limit power value, and in which the second amplifier is amplified within a range of a first upper limit power value, wherein, when transmissions by both communication systems are performed in parallel, the control unit performs a second control of performing at least one of that the first amplifier performs amplification within a range equal to or less than a third upper limit power value that is less than the first upper limit power value and that the second amplifier performs amplification within a range equal to or less than a fourth upper limit power value that is less than the second upper limit power value.

11 Claims, 6 Drawing Sheets

PORTABLE COMMUNICATION TERMINAL, AND POWER AMPLIFICATION CONTROL METHOD AND PROGRAM

CROSS-REFERENCE TO RELATED APPLICATION

This application claims priority from Japanese Patent Application No. 2011-088536 filed on Apr. 12, 2011, the entire subject matter of which is incorporated herein by reference.

TECHNICAL FIELD

This disclosure relates to a portable communication terminal such as a portable phone having a plurality of amplifiers to amplify transmission signals, and specifically to a technology of suppressing a rise in temperature of a portable communication terminal.

BACKGROUND

A temperature of a portable communication terminal rises due to heat radiated from internal components of the portable communication terminal, specifically, high-heat-generating components such as an amplifier for amplifying power of a transmission signal (hereinafter, referred to as a transmission amplifier).

As a technology for suppressing occurrence of that, for example, a technology of JP-A-H8-204587 has been known.

According to the technology of JP-A-H8-204587, in a case where a rise in temperature of a portable communication terminal having one transmission amplifier causes a reduction in amplification degree of the transmission amplifier and then an upper limit value of power amplification (which is a value required by a base station) is not obtained, the upper limit value is reduced according to the internal temperature of the portable communication terminal so that stable transmission power is obtained.

Also, there is a known portable communication terminal including a transmission amplifier corresponding to transmission in a first communication system and a transmission amplifier corresponding to transmission in a second communication system.

This portable communication terminal having two transmission amplifiers, a total amount of heat generated by both transmission amplifiers is larger than that of a portable communication terminal having one transmission amplifier.

SUMMARY

However, the technology of JP-A-H8-204587 considers only a case where the portable communication terminal has one transmission amplifier, and then is not applied to a case where there are two transmission amplifiers.

With taking into consideration the above, this disclosure provides at least a portable communication terminal capable of transmission in a first communication system and transmission in a second communication system and capable of appropriately suppression of a rise in temperature of the portable communication terminal.

In view of the above, a portable communication terminal comprises: a first amplifier configured to amplify a transmission signal of a first communication system; a second amplifier configured to amplify a transmission signal of a second communication system; and a control unit configured to perform a first control, in which the first amplifier is controlled to perform amplification within a range equal to or less than a first upper limit power value, and in which the second amplifier is controlled to perform amplification within a range equal to or less than a second upper limit power value, in accordance with a communication situation. When transmission by the first communication system and transmission by the second communication system are performed in parallel, the control unit performs a second control of performing at least one of a first amplification and a second amplification. In the first amplification, the first amplifier performs amplification within a range equal to or less than a third upper limit power value that is less than the first upper limit power value. In the second amplification, the second amplifier performs amplification within a range equal to or less than a fourth upper limit power value that is less than the second upper limit power value.

According to the portable communication terminal of this disclosure having the above-mentioned configuration, in the portable communication terminal capable of transmission in the first communication system and transmission in the second communication system, it is possible to appropriately suppress a rise in temperature of the portable communication terminal.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Hereinafter, a portable phone will be described as an embodiment of a portable communication terminal according to this disclosure.

First Embodiment

<Outline>

A portable phone according to a first embodiment is a terminal which corresponds to both of a code division multiple access (CDMA) 2000 mobile communication system (hereinafter, referred to as a CDMA system), and a long-term evolution mobile communication system (hereinafter, referred to as an LTE system), and is capable of parallel transmission.

As a case transmission in both systems is performed in parallel, it is possible to consider a case of registering the location of the portable phone 100 using the LTE system when a user makes a voice call with the CDMA system while moving.

Like this, in a case where transmission in both systems is performed in parallel, the portable phone may reduce an upper limit power value of each amplifier which are included in the portable phone, and performs power amplification on a transmission signal to be used in each system, based on a current transmission power value of each amplifier, so that the upper limit power value is that is reduced from an upper limit power value of a case where only transmission in one system is performed. In this way, it is possible to suppress heat generation of both amplifiers.

Hereinafter, a frequency band (for example, a frequency band of 800 MHz) which is used in the CDMA system is referred to as a first frequency band, and a frequency band (for example, a frequency band of 2 GHz) which is used in the LTE system is referred to as a second frequency band.

<Functional Configuration>

Figure 1:
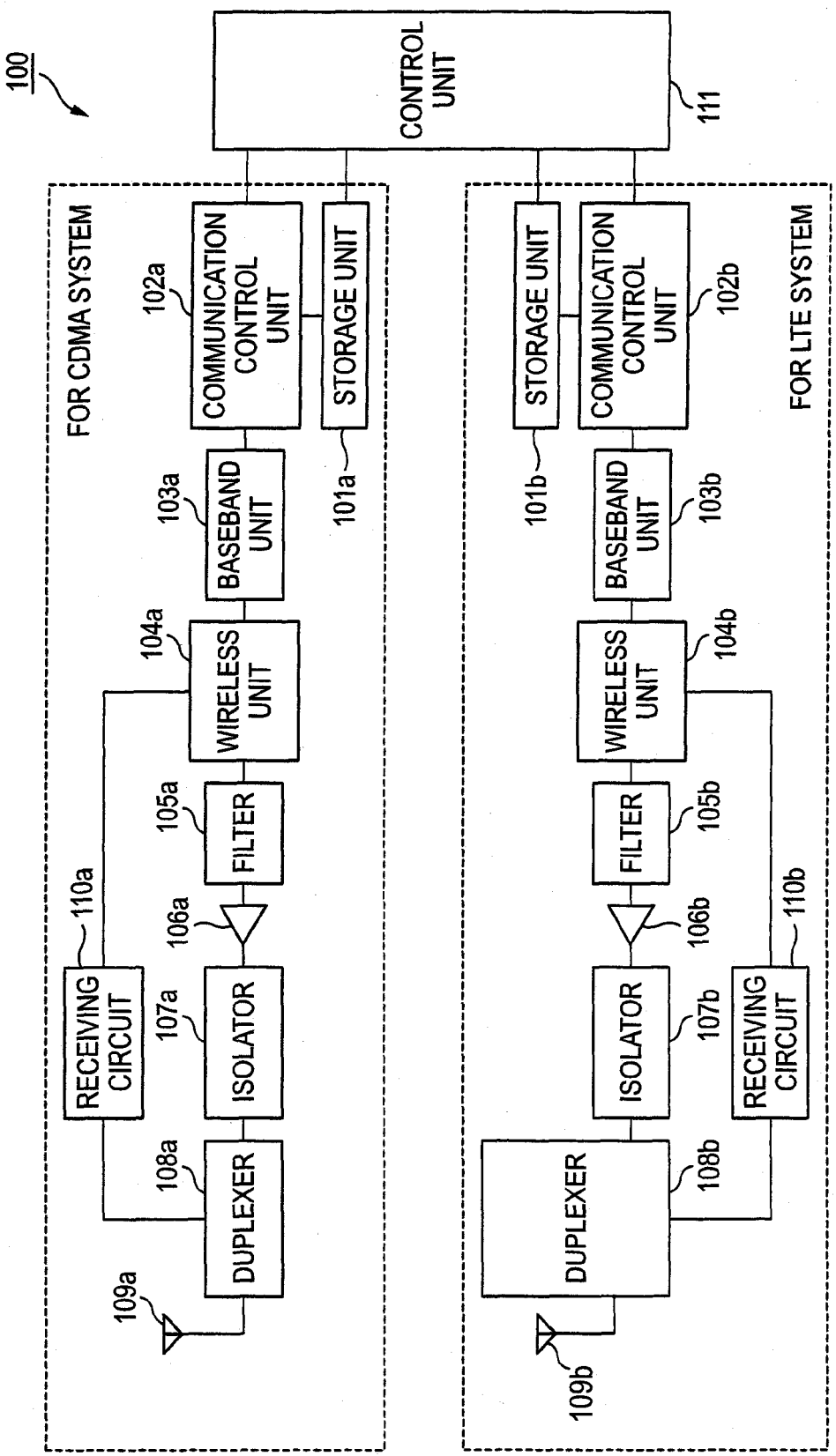
FIG. 1 is a block diagram illustrating a functional configuration of main parts of a portable phone according a first embodiment.

FIG. 1 is a block diagram illustrating a functional configuration of main parts of a portable phone 100 according a first embodiment.

As shown in FIG. 1, the portable phone 100 includes functional components for the CDMA system and functional components for the LTE system respectively, and includes storage units 101a and 101b, communication control units 102a and 102b, baseband units 103a and 103b, wireless units 104a and 104b, filters 105a and 105b, amplifiers 106a and 106b, isolators 107a and 107b, duplexers 108a and 108b, antennas 109a and 109b, receiving circuits 110a and 110b, and a control unit 111.

Further, the portable phone 100 includes a processor and a memory, and the processor executes programs stored in the memory to achieve the function of the control unit 111.

Here, the storage unit 101a is a memory area for storing information representing a current upper limit power value (hereinafter, referred to as upper limit value information) of the amplifier 106a for the CDMA system, and the storage unit 101b is a memory area for storing upper limit value information representing a current upper limit power value of the amplifier 106b for the LTE system.

The communication control unit 102a has a function of receiving an instruction from the control unit 111, and controlling communication of the CDMA system. Specifically, the communication control unit 102a instructs the amplifier 106a to perform power amplification within a current upper limit power value range represented by the upper limit value information stored in the storage unit 101a.

Also, the communication control unit 102b has a function of receiving an instruction from the control unit 111, and controlling communication of the LTE system. Specifically, the communication control unit 102b instructs the amplifier 106b to perform power amplification within a current upper limit power value range represented by the upper limit value information stored in the storage unit 101b.

In an LTE system, basically, multiple input multiple output (MIMO) communication is performed. The LTE system of the portable phone 100 also performs MIMO communication.

The baseband unit 103a has a function of receiving a baseband signal from the communication control unit 102a, converting the baseband signal into a digital signal, and transmitting the digital signal to the wireless unit 104a.

The baseband unit 103b has a function of receiving a baseband signal from the communication control unit 102b, converting the baseband signal into a digital signal, and transmitting the digital signal to the wireless unit 104b.

The baseband unit 103b transmits each digital signal component corresponding to each transmission signal component to be finally transmitted from the antenna 109b, and each component is processed in the subsequent wireless unit 104b, the filter 105b, the amplifier 106b, the isolator 107b, and the duplexer 180b. As long as it is unnecessary to separately describe processes on each component, the individual components are expressed generally as a signal.

The wireless unit 104a has a function of receiving the digital signal from the baseband unit 103a, converting the digital signal into a wireless signal, and transmits the wireless signal to the amplifier 106a through the filter 105a. Also, The wireless unit 104b has a function of receiving the digital signal from the baseband unit 103b, converting the digital signal into a wireless signal, and transmits the wireless signal to the amplifier 106b through the filter 105b.

The filter 105a is a band-pass filter, which is inserted between the wireless unit 104a and the amplifier 106a, and passes a signal having a frequency band corresponding to the amplifier 106a (hereinafter, referred to as a first frequency band) from among wireless signals received from the wireless unit 104a.

The filter 105b is a band-pass filter, which is inserted between the wireless unit 104b and the amplifier 106b, and passes a signal having a frequency band corresponding to the amplifier 106b (hereinafter, referred to as a second frequency band) from among wireless signals received from the wireless unit 104b.

The amplifier 106a is an amplifier for power amplification on a transmission signal of the first frequency band, and has a function of receiving a signal from the filter 105a, and amplifying the signal according to an instruction of the communication control unit 102a.

The amplifier 106b is an amplifier for power amplification on a transmission signal of the second frequency band, and has a function of receiving a signal from the filter 105b, and amplifying the signal according to an instruction of the communication control unit 102b.

The isolators 107a and 107b are non-reciprocal components for suppressing backflow of the transmission signals.

The duplexer 108a is connected to the antenna 109a for the first frequency band, and the duplexer 108b is connected to the antenna 109b for the second frequency band. The duplexers are components for electrically separating a transmission path and a reception path from each other, so that simultaneous transmission and reception may be achieved.

The receiving circuits 110a and 110b include reception amplifiers (not shown) and so on. The receiving circuit 110a transmits a received signal to the wireless unit 104a, and the receiving circuit 110b transmits a received signal to the wireless unit 104b.

The control unit 111 performs control on the portable phone 100 entirely, and specifically has a function of setting (updating) the upper limit value information of each of the storage units 101a and 101b, so that, in a period when transmission of both systems is performed in parallel, each of the amplifiers performs power amplification on the transmission signal within the upper limit power value range lower than the upper limit power value in a period when only transmission of any one system is performed, based on the current transmission power value of each of the amplifiers.

Further, the control unit 111 sets the upper limit value information of the storage unit 101a so that the upper limit value information is to be a first upper limit power value (for example, 23 dBm) in a period when only transmission of the CDMA system is performed, and sets the upper limit value information of the storage unit 101b so that the upper limit value information is to be a second upper limit power value (for example, 22 dBm) in a period when only transmission of the LTE system is performed.

<Operation>

Next, an operation of the portable phone 100 having the above-mentioned configuration will be described with reference to FIG. 2.

Figure 2:
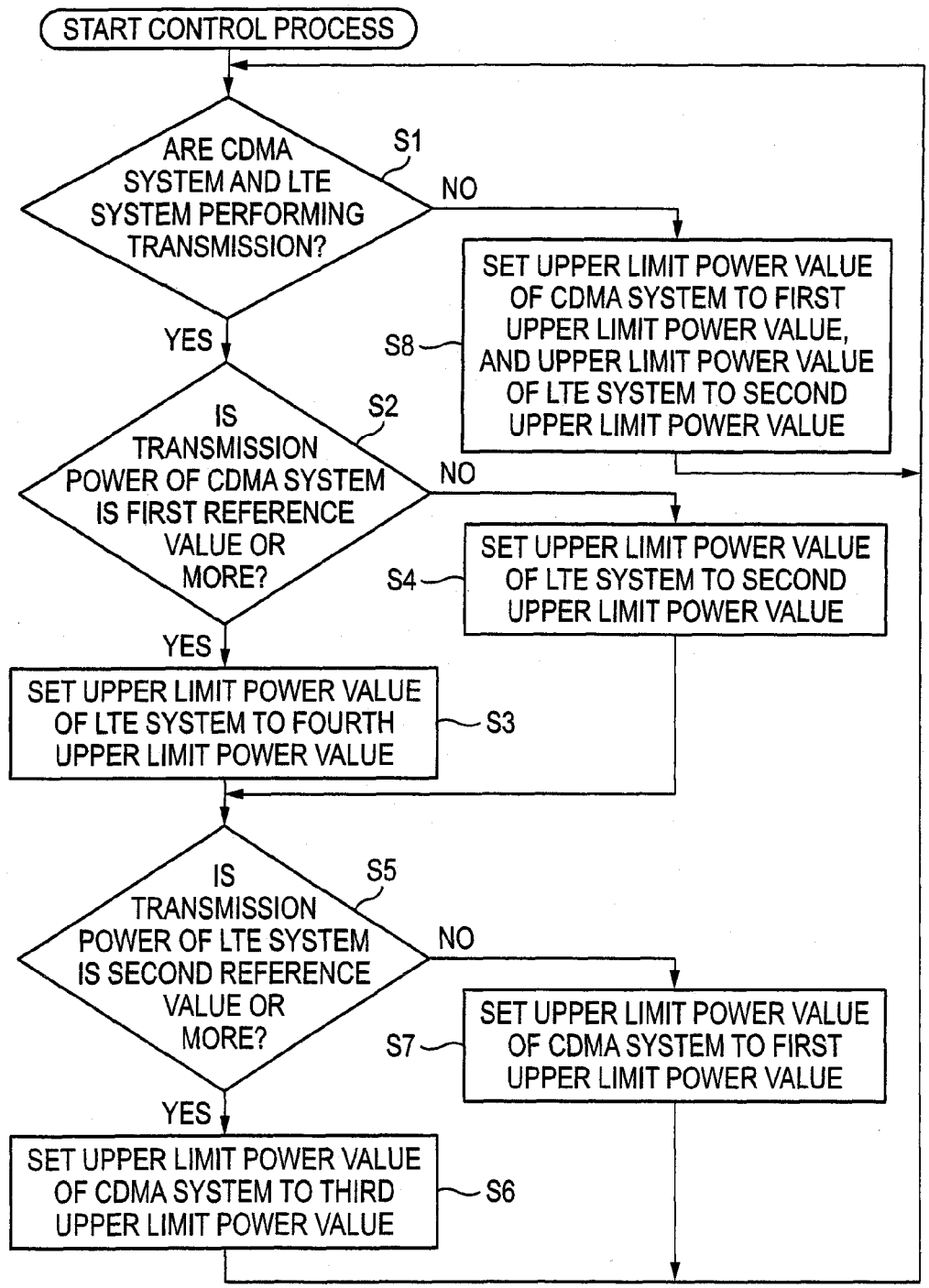
FIG. 2 is a flow chart illustrating a control process of the portable phone.

FIG. 2 is a flow chart illustrating a control process of the portable phone 100.

The control process shown in FIG. 2 starts when a power supply of the portable phone 100 is turned on. Further, although not shown specifically, if the power supply is turned off, the control process finishes.

First, in step S1, the control unit 111 determines whether both of the CDMA system and the LTE system are performing transmission in parallel.

In a case where both systems are performing transmission in parallel (YES in step S1), in step S2, the control unit 111 determines whether the current transmission power value of the amplifier 106*a* of the CDMA system is a predetermined value (hereinafter, referred to as a first reference value and set to, for example, 10 dBm) or more.

In a case where the current transmission power value of the amplifier 106*a* is the first reference value or more (YES in step S2), in step S3, the control unit 111 sets the upper limit value information of the storage unit 101*b* so that the upper limit value information is to be a value (hereinafter, referred to as a fourth upper limit power value) that is reduced from the second upper limit power value by a predetermined value (for example, 1 dB). In a case where the current transmission power value of the amplifier 106*a* is less than the first reference value (NO in step S2), in step S4, the control unit 111 sets the upper limit value information of the storage unit 101*b* so that the upper limit value information is to be the second upper limit power value.

If completing the process of step S3 or step S4, in step S5, the control unit 111 determines whether the current transmission power value of the amplifier 106*b* of the LTE system is a predetermined value (hereinafter, referred to as a second reference value and set to, for example, 10 dBm) or more.

In a case where the current transmission power value of the amplifier 106*b* is the second reference value or more (YES in step S5), in step S6, the control unit 111 sets the upper limit value information of the storage unit 101*a* so that the upper limit value information is to be a value (hereinafter, referred to as a third upper limit power value) that is reduced from the first upper limit power value by a predetermined value (for example, 1 dB). In a case where the current transmission power value of the amplifier 106*b* is less than the second reference value (NO in step S5), in step S7, the control unit 111 sets the upper limit value information of the storage unit 101*a* so that the upper limit value information is to be the first upper limit power value.

When completing the process of step S6 or step S7, the control unit 111 performs the control process from step S1 again.

In a case where both systems are not performing transmission in parallel, that is, a case where only one system is performing transmission or any systems are not performing transmission (NO in step S1), in step S8, the control unit 111 sets the upper limit value information of the storage unit 101*a* so that the upper limit value information is to be the first upper limit power value, and sets the upper limit value information of the storage unit 101*b* so that the upper limit value information is to be the second upper limit power value. Then, the control unit 111 performs the control process from step S1 again.

Second Embodiment

<Outline>

In the first embodiment, it is described as an example that the portable phone 100 reduces the upper limit power value of the amplifier 106*a* to the third upper limit power value, and reduces the upper limit power value of the amplifier 106*b* to the fourth upper limit power value, based on the current transmission power values of the amplifiers 106*a* and 106*b* in a period when both systems perform transmission in parallel.

In a second embodiment, it will be mainly described as a difference that the upper limit power values of the amplifiers are reduced based on temperatures around the amplifiers in a period when both systems perform transmission in parallel, from the portable phone 100 according to the first embodiment.

<Functional Configuration>

Figure 3:
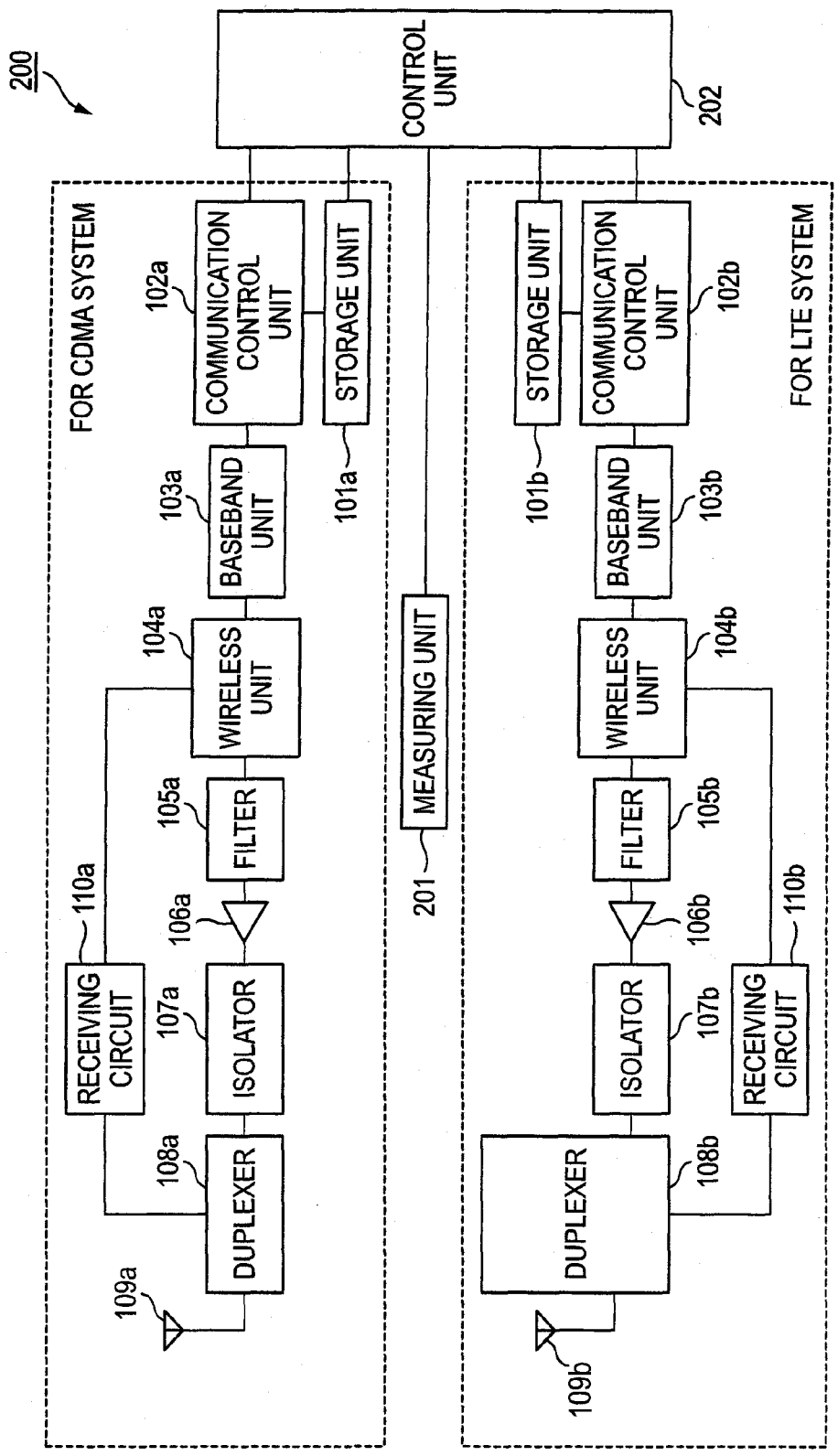
FIG. 3 is a block diagram illustrating a functional configuration of main parts of a portable phone according a second embodiment.

FIG. 3 is a block diagram illustrating a functional configuration of main parts of a portable phone 200 according a second embodiment.

As shown in FIG. 3, the portable phone 200 is different from the portable phone 100 in that the portable phone 200 includes a control unit 202, instead of the control unit 111 of the portable phone 100 according to the first embodiment, and further includes a measuring unit 201.

Here, the measuring unit 201 includes a temperature measuring sensor such as a thermistor, and has a function of comparing an actual voltage of the thermistor with a predetermined voltage V1 when the temperature of the thermistor was a threshold value T1, so as to measure a temperature at the position of the measuring unit 201.

The measuring unit 201 is provided at a position on a substrate which is close to the amplifiers 106*a* and 106*b* and is equidistant from the amplifiers, or a position in an internal space of a case, not on the substrate, to which heat radiated from the amplifiers is transferred or to which heat is transferred by convection current.

The control unit 202 is different from the control unit 111 according to the first embodiment in that the control unit 202 determines whether to make the amplifier 106*a* perform power amplification on the transmission signal within a range equal to or less than the third upper limit power value, and whether to make the amplifier 106*b* perform power amplification on the transmission signal within a range equal to or less than the fourth upper limit power value, based on the temperature measured by the measuring unit 201.

<Operation>

Next, an operation of the portable phone 200 having the above-mentioned configuration will be described with reference to FIG. 4.

Figure 4:
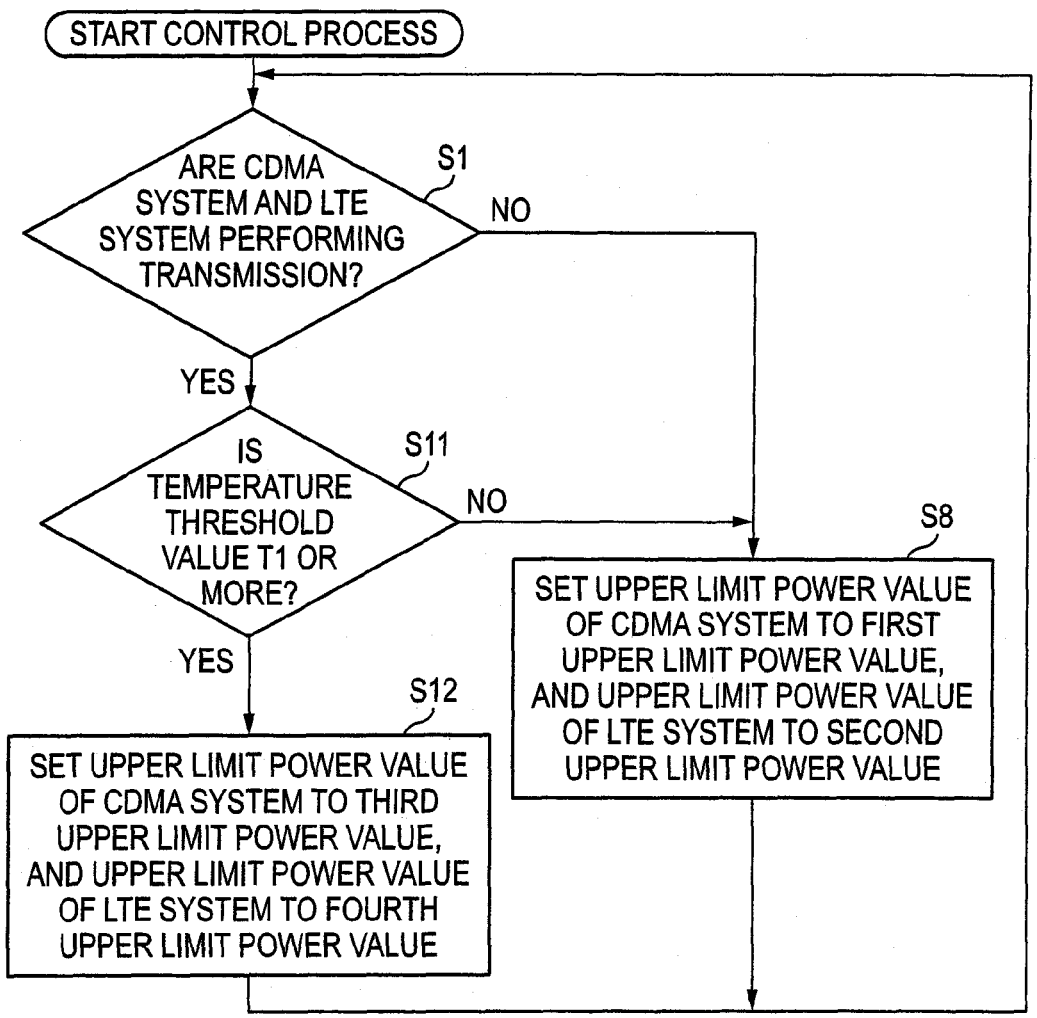
FIG. 4 is a flow chart illustrating a control process of the portable phone.

FIG. 4 is a flow chart illustrating a control process of the portable phone 200.

The control process shown in FIG. 4 starts when a power supply of the portable phone 200 is turned on. Further, although not shown in detail, if the power supply is turned off, the control process finishes.

Similarly to the control unit 111 according to the first embodiment, first, in step S1, the control unit 202 determines whether both of the CDMA system and the LTE system are performing transmission in parallel. In a case where both systems are not performing transmission in parallel (NO in step S1), in step S8, the control unit 202 performs a process of setting the upper limit value information of the storage units so that the upper limit value information of the storage units are to be the first and second upper limit power values. Then, the control unit 202 performs the control process from step S1 again.

In a case where both systems are performing transmission in parallel (YES in step S1), in step S11, the control unit 202 determines whether the temperature measured by the measuring unit 201 is the threshold value T1 or more. In a case where the measured temperature is less than the threshold value T1 (NO in step S11), the control unit 202 performs a process of step S8, and then performs the control process from step S1 again.

In a case where the measured temperature is the threshold value T1 or more (YES in step S11), in step S12, the control unit 202 sets the upper limit value information of the storage units, similarly the processes of steps S3 and S6 of the control unit 111 according to the first embodiment.

In other words, the control unit 202 sets the upper limit value information of the storage unit 101a so that the upper limit value information is to be the value (the third upper limit power value) that is reduced from the first upper limit power value by the predetermined value (for example, 1 dB). Further, the control unit 202 sets the upper limit value information of the storage unit 101b so that the upper limit value information is to be the value (the fourth upper limit power value) that is reduced from the second upper limit power value by the predetermined value (for example, 1 dB).

If completing the process of step S12, the control unit 202 performs the control process from step S1 again.

Third Embodiment

<Outline>
In the first and second embodiments, it is described as the examples that the portable terminals reduce the upper limit power values of both amplifiers under predetermined conditions in a period when both systems perform transmission in parallel.

In a third embodiment, it be described an example that only an upper limit power value of an amplifier of a low-priority system is reduced based on predetermined priorities in a period when both systems perform transmission in parallel.

In this third embodiment, an example in which the upper limit power value of the amplifier of the low-priority system is reduced, and if a predetermined time period elapses, the transmission of the low-priority system stops based on the temperature measured by the measuring unit 201 will also be described.

Figure 5:
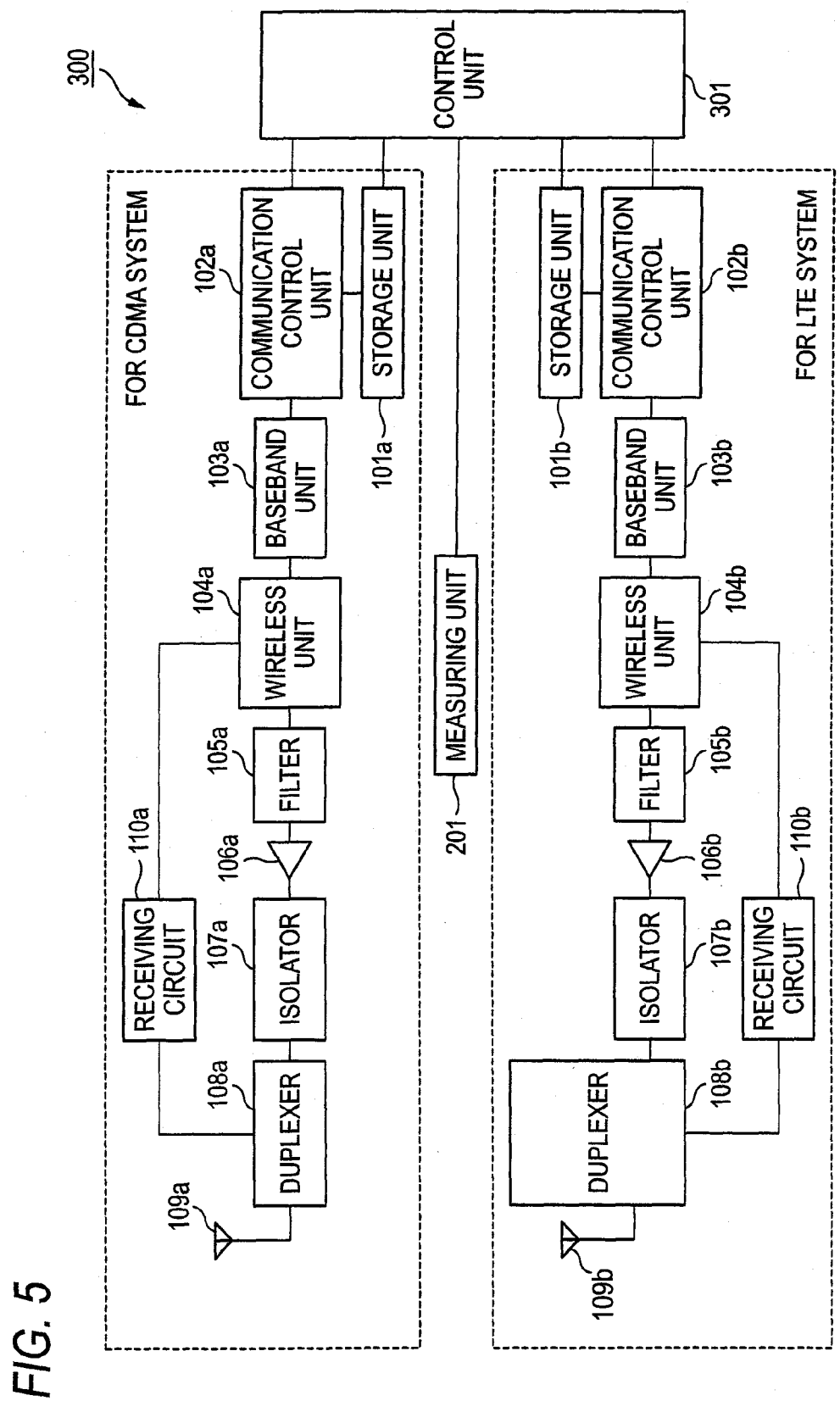
FIG. 5 is a block diagram illustrating a functional configuration of main parts of a portable phone according a third embodiment.

Hereinafter, a difference of the third embodiment from the portable phone 200 according to the second embodiment will be mainly described.
<Functional Configuration>
FIG. 5 is a block diagram illustrating a functional configuration of main parts of a portable phone 300 according a third embodiment.

As shown in FIG. 5, a portable phone 300 is different from the portable phone 200 in that the portable phone 300 includes a control unit 301, instead of the control unit 202 of the portable phone 200 according to the second embodiment.

The control unit 301 is different from the control unit 202 according to the second embodiment in that the control unit 301 reduces the upper limit power value of any one of the amplifiers, based on the predetermined priorities, in the period when both systems perform transmission in parallel.

In this example, it is assumed that the priorities are set before the portable phone 300 is shipped from a factory, so that a high priority is set for the CDMA system, and are changeable by user's operation.

The control unit 301 has a function of controlling each communication control unit so that, as described above, the upper limit power value of any one system is reduced, and the transmission of the low-priority system stops based on the temperature measured by the measuring unit 201 when the predetermined time period is elapsed.
<Operation>
Next, an operation of the portable phone 300 having the above-mentioned configuration will be described with reference to FIG. 6.

Figure 6:
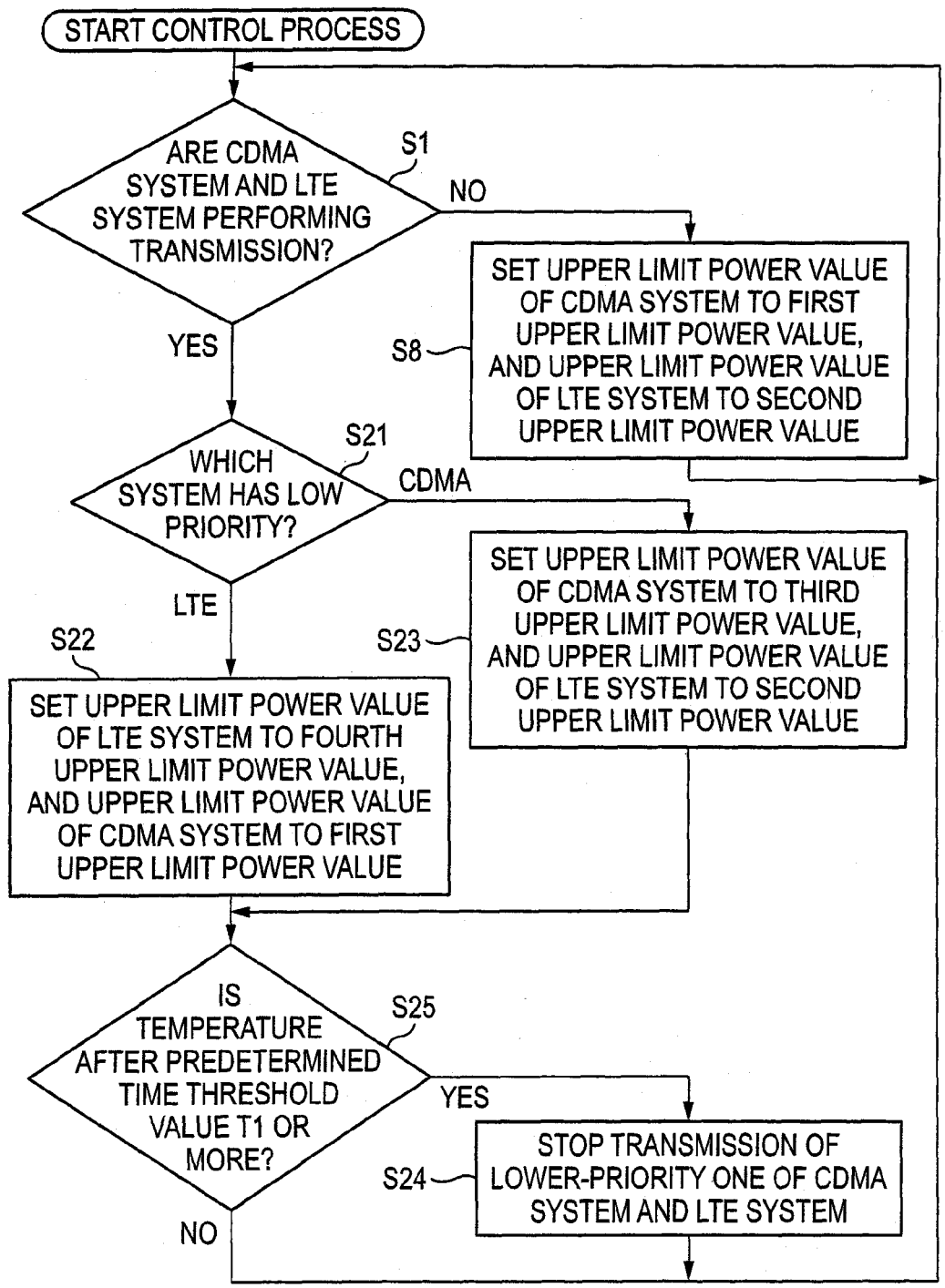
FIG. 6 is a flow chart illustrating a control process of the portable phone.

FIG. 6 is a flow chart illustrating a control process of the portable phone 300.

The control process shown in FIG. 6 starts when a power supply of the portable phone 300 is turned on. Further, although not shown in detail, if the power supply is turned off, the control process finishes.

Similarly to the control unit 202 according to the first embodiment, first, in step S1, the control unit 301 determines whether both of the CDMA system and the LTE system are performing transmission in parallel. In a case where both systems are not performing transmission in parallel (NO in step S1), in step S8, the control unit 301 performs a process of setting the upper limit value information of the storage units so that the upper limit value information of the storage units are to be the first and second upper limit power values. Then, the control unit 301 performs the control process from step S1 again.

In a case where both systems are performing transmission in parallel (YES in step S1), in step S21, the control unit 301 determines which of both systems has a predetermined low priority.

In a case where the LTE system has a priority lower than that of the CDMA system ('LTE' in step S21), in step S22, the control unit 301 sets the upper limit value information of the storage unit 101a so that the upper limit value information is to be the first upper limit power value, and sets the upper limit value information of the storage unit 101b so that the upper limit value information is to be the value (the fourth upper limit power value) that is reduced from the second upper limit power value by the predetermined value (for example, 1 dB).

In a case where the CDMA system has a priority lower than that of the LTE system ('CDMA' in step S21), in step S23, the control unit 301 sets the upper limit value information of the storage unit 101b so that the upper limit value information is to be the second upper limit power value, and sets the upper limit value information of the storage unit 101a so that the upper limit value information is to be the value (the third upper limit power value) that is reduced from the first upper limit power value by the predetermined value (for example, 1 dB).

If the process of step S22 or S23 is completed, after a predetermined time period, in step S25, the control unit 301 determines whether the temperature measured by the measuring unit 201 is equal to or more than the threshold value T1, similarly to the control unit 202 according to the second embodiment,.

In a case where the measured temperature is lower than the threshold value T1 (NO in step S25), the control unit 301 performs the control process from step S1 again. In a case where the measured temperature is the threshold value T1 or higher (YES in step S25), in step S24, the control unit 301 instructs the communication control unit of the low-priority system to stop the signal transmission. Then, the control unit 301 performs the control process from step S1 again. cl [Additional Notes]

Although the portable communication terminals according to this disclosure have been described based on the first to third embodiments, it goes without saying that this disclosure can be modified as follows, and is not limited to the portable communication terminals as shown in the above-mentioned individual embodiments.

(1) In the portable phones according to the embodiments, as shown in FIGS. 2, 4, an 6, in the case where both of the CDMA system and the LTE system are not performing transmission in parallel (NO in step S1), the process of step S8 is always performed. However, only in a case where the upper limit value information of the storage unit 101a does not correspond to the first upper limit power value, the upper limit value information may be set to the first upper limit power value, and only in a case where the upper limit value information of the storage unit 101b does not corresponded to the second upper limit power value, the upper limit value information may be set to the second upper limit power value.

(2) In the individual embodiments, the CDMA system and the LTE system have been described as examples of a first communication system and a second communication system are. However, the first communication system and the second communication system may be other communication systems.

Further, in the individual embodiments, the first upper limit power value and the second upper limit power value are different from each other, and the first reference power value and the second reference power value are the same as each other. However, the first upper limit power value and the second upper limit power value may be the same as each other, and the first reference power value and the second reference power value may be different from each other. Further, in the embodiments, the first reference power value and the second reference power value are set for 10 dBm as an example and but is not limited thereto. The first reference power value and the second reference power may be set based on the communication situation and may be set based on a displacement of amplifier or a casing of the mobile communication terminal.

In the individual embodiments, the upper limit power values of the amplifiers for both systems are reduced each time by the predetermined value (1 dB in the examples of the individual embodiments). However, the predetermined value may be different for each system. For example, the predetermined value for a low-priority system may be larger than the predetermined value for a high-priority system, or it is possible to enable the user to set the predetermined value to an arbitrary value.

(3) In the portable phones according to the embodiments, as shown in FIGS. 2, 4, and 6, in the case where both of the CDMA system and the LTE system are not performing transmission in parallel, if the process of step S6 or S7 of FIG. 2, the process of step S12 or S8 of FIG. 4, or the process of step S25 or S24 of FIG. 6 is completed, similarly to step S1, a process of determining whether both of the CDMA system and the LTE system are performing transmission in parallel may be performed. If both systems are performing transmission in parallel, that determining process is repeatedly performed, and if both systems are not performing transmission in parallel, the control process may proceed to the process of step S8.

(4) In the first embodiment, the portable phone performs both of the process of reducing the upper limit power value of the amplifier 106b of the LTE system under a certain condition, and the process of reducing the upper limit power value of the amplifier 106a of the CDMA system under a certain condition. However, the portable phone may perform only one of those processes.

In other words, the portable phone may perform only either the group of the processes of step S2 to S4 or the group of the processes of step S5 to S7 of FIG. 2.

Likewise, the step S12 of the control process of the portable phone 200 according to the second embodiment shown in FIG. 4 may de modified to reduce only the upper limit power value of any one system.

It is possible to enable the user to set which of the upper limit power values of the amplifiers of both systems will be reduced.

In the first embodiment, in the case where both of the CDMA system and the LTE system are performing transmission in parallel, the portable phone performs the process of reducing the upper limit power value of the amplifier 106b of the LTE system under the certain condition, and the process of reducing the upper limit power value of the amplifier 106a of the CDMA system under the certain condition.

However, in the case where both of the CDMA system and the LTE system are performing transmission in parallel, the portable phone may unconditionally perform at least one of the process of reducing the upper limit power value of the amplifier 106b of the LTE system and the process of reducing the upper limit power value of the amplifier 106a of the CDMA system.

(5) The portable phone 200 according to the second embodiment includes one measuring unit to measure the temperature around the amplifiers. However, the portable phone 200 may be modified to include a plurality of measuring units, measure the temperatures of the individual amplifiers, and perform control so that the upper limit power value of an amplifier, having the temperature equal to or higher than the threshold value T1, of the individual amplifiers is reduced.

Likewise, the portable phone 300 according to the third embodiment may be modified to include a plurality of measuring units, and the process of step S11 is modified to measure the temperature of a low-priority amplifier after predetermined time elapses from the step S22 or S23 of FIG. 6.

If a plurality of measuring units is provided, finer control becomes possible as compared to the case where one measuring unit is provided.

Also, a heat insulator may be provided between the individual amplifiers, so that the individual measuring units can more accurately measure the temperatures of corresponding amplifiers.

In the case where the portable phone is modified to include a plurality of measuring units, the threshold value T1 for the temperature may be different for each system. For example, it is possible to increase the threshold value for the temperature of a higher-priority system based on the priorities of the systems, or to enable the user to set an arbitrary temperature as the threshold value.

(6) In the case where both of the CDMA system and the LTE system are performing transmission in parallel, the portable phone 300 according to the third embodiment reduces the upper limit power value of the amplifier of the lower-priority system based on the predetermined priorities, and stops the transmission of the lower-priority system based on the temperature measured by the measuring unit 201 after the predetermined time.

However, the portable phone may perform control only to reduce the upper limit power value of the amplifier of the lower-priority system, based on the predetermined priorities. In other words, the portable phone 300 may be modified so that, if the process of step S22 is completed, the control process is performed from step S1 again, without performing the processes of step S11 and S24 of FIG. 6.

(7) All or some of the components described with respect to each embodiment may be implemented by one chip, or an integrated circuit of a plurality of chips, or may be implemented by programs for a computer, or may be implemented in other forms.

Further, each component described with respect to each embodiment implements its function in cooperation with the processor of the portable phone.

(8) Programs for performing the control processes (see FIGS. 2, 4, and 6) of the portable phones described with respect to the embodiments may be recorded on recording media and may be distributed, or may be distributed through various communication channels or the like. As those recording media, there are an IC card, a hard disk, an optical disk, a flexible disk, a ROM, a flash memory, and the like. The distributed programs may be stored in a memory or the like which is readable in a device, and be provided for use so that the processor performs the programs, thereby implementing the functions of the portable phones according to the embodiments.

(9) In the embodiments, the upper limit power values of the amplifiers of both systems are reduced from the first upper limit power value and the second upper limit power value by the predetermined value (1 dB in the examples of the embodiments). However, each upper limit value may be reduced stepwisely.

In other words, in the process of step S3 or S6 of FIG. 2, the process of step S12 of FIG. 4, or the process of step S22 or S23 of FIG. 6, it is possible to reduce the upper limit value from the current upper limit value set in each storage unit, by a predetermined value. In this case, in order to suppress a rapid reduction in the upper limit power value, for example, a standby step for constant time may be added after the process of the step S6 or S7 of FIG. 2, the process of step S12 or S8 of FIG. 4, or the process of step S25 or S24 of FIG. 6.

(10) Parts or all of the above-mentioned modifications of (1) to (9) may be combined and applied to the portable phones according to the respective embodiments.

(11) Hereinafter, a configuration of a portable communication terminal according to embodiments of this disclosure, its modifications, and their effects will be further described.

A portable communication terminal of includes: a first amplifier configured to amplify a transmission signal of a first communication system; a second amplifier configured to amplify a transmission signal of a second communication system; and a control unit configured to perform a first control, in which the first amplifier is controlled to perform amplification within a range equal to or less than a first upper limit power value, and in which the second amplifier is controlled to perform amplification within a range equal to or less than a second upper limit power value, in accordance with a communication situation. When transmission by the first communication system and transmission by the second communication system are performed in parallel, the control unit performs a second control of performing at least one of a first amplification and a second amplification. In the first amplification, the first amplifier performs amplification within a range equal to or less than a third upper limit power value that is less than the first upper limit power value. In the second amplification, the second amplifier performs amplification within a range equal to or less than a fourth upper limit power value that is less than the second upper limit power value.

According to this portable communication terminal, in a case where transmission by the first communication system and transmission by the second communication system are performed in parallel, the upper limit power value of at least one amplifier is reduced as compared to a case where only transmission by a communication system corresponding to that amplifier is performed. Therefore, it is possible to appropriately suppress a rise in the temperature of the portable communication terminal even in the case where transmission by both communication systems is performed in parallel.

In the above-described portable communication terminal, in a case where the first amplifier performs amplification within a range equal to or greater than a predetermined first reference power value, the control unit may control the second amplifier to perform the amplification within the range equal to or less than the fourth upper limit power value.

In a case where a communication situation is relatively bad, it is generally required to increase transmission power values of the amplifiers, as compared to a case where a communication situation is relatively good. In other words, in a case where a transmission power value of an amplifier is relatively high, if the upper limit power value of the amplifier is reduced, it is generally going to be unlikely that communication could is maintained.

According to the portable communication terminal, since the first reference power value is appropriately determined, in the case where transmission by the first communication system and transmission by the second communication system are performed in parallel and in the case where the current transmission power value of the first amplifier is relatively high, the upper limit power value of the second amplifier is reduced. Therefore, it is possible to appropriately suppress a rise in the temperature of the portable communication terminal while maintaining the transmission by a communication system corresponding to the first amplifier.

The above-described portable communication terminal may include: a measuring unit configured to measure a temperature. In a case where a temperature measured by the measuring unit is equal to or higher than a threshold value, the control unit may perform the second control.

According to this portable communication terminal, if the threshold value is appropriately set, even in the case where transmission by the first communication system and transmission by the second communication system are performed in parallel, when the temperature of the terminal is relatively low, it is possible to maintain the upper limit power value of a case where only transmission by a communication system corresponding to each amplifier is performed. In other words, according to this portable communication terminal, it is possible to appropriately maintain transmission by each communication system.

In the above-described portable communication terminal, the control unit may repeatedly determine whether the temperature measured by the measuring unit is equal to or higher than the threshold value. Every time when it is determined that the measured temperature is equal to or higher than the threshold value, the control unit may control to perform that the upper limit power value of at least one amplifier is reduced to be less than an upper limit power value at the time of the corresponding determination.

According to this portable communication terminal, since the threshold value is appropriately set, in the case where transmission by the first communication system and transmission by the second communication system are performed in parallel, while the temperature of the terminal is relatively high, the upper limit power value of at least one amplifier is gradually reduced. Therefore, it is possible to maintain the transmission by each communication system while suppressing a rise in the temperature of the portable communication terminal as possible.

In the above-described portable communication terminal, in a case where the determination result changes from the state where the temperature measured by the measuring unit is equal to or higher than the threshold value to a state where the measured temperature is lower than the threshold value, the control unit may stop the second control and then may perform the first control, in which the first amplifier is controlled to perform the amplification within the range equal to or less than the first upper limit power value and the second amplifier is controlled to perform the amplification within the range equal to or less than the second upper limit power value.

According to this portable communication terminal, in a case where the upper limit power value of at least one amplifier is gradually reduced so that the temperature of the terminal becomes relatively low, it is possible to return that the upper limit power value of each amplifier to the upper limit power value of the case where only transmission based a communication system corresponding to each amplifier is performed.

In other words, according to this portable communication terminal, in the case where transmission by the first communication system and transmission by the second communication system are performed in parallel, when the temperature of the terminal is relatively low, it is possible to prioritize maintenance of the transmission by each communication system.

In the above-described portable communication terminal, the control unit may specify a lower-priority amplifier as a target amplifier for the control, based on a predetermined priority of the respective communication systems.

According to this portable communication terminal, in the case where transmission by the first communication system and transmission by the second communication system are performed in parallel, it is possible to reduce the upper limit power value of the lower-priority amplifier, for example, an amplifier for relatively less important transmission. Therefore, it is possible to maintain important transmission.

The above-described portable communication terminal may further includes: a measuring unit configured to measure a temperature; a first transmitting unit that includes the first amplifier and transmits a signal amplified by the first amplifier by the first communication system; and a second transmitting unit that includes the second amplifier and transmits a signal amplified by the second amplifier by the second communication system. After the control unit performs the second control, in a case where the temperature measured by the measuring unit is equal to or higher than a threshold value, the control unit may stop the transmission of the specified target amplifier.

According to this portable communication terminal, since the threshold value is appropriately set, in the case where transmission by the first communication system and transmission by the second communication system are performed in parallel, if the temperature of the terminal is relatively high even after the upper limit power value of the lower-priority amplifier is reduced, it is possible to stop the transmission by a communication system corresponding to the lower-priority amplifier.

In other words, according to this portable communication terminal, it is possible to suppress a rise in the temperature of the portable communication terminal while maintaining more reliably the more important transmission.

In the above-described portable communication terminal, when transmission by the first communication system and transmission by the second communication system are performed in parallel, the control unit may control the first amplifier to perform amplification within the range equal to or less than the third upper limit power value and control the second amplifier to perform amplification within the range equal to or less than the fourth upper limit power value.

According to this portable communication terminal, in the case where transmission by the first communication system and transmission by the second communication system are performed in parallel, the upper limit power value of each of both amplifiers is reduced to be lower than that of the case where only transmission by a communication system corresponding to the corresponding amplifier is performed. Therefore, it is possible to more appropriately suppress a rise in the temperature of the portable communication terminal.

In the above-described portable communication terminal, the control unit may repeatedly determine whether transmission by the first communication system and transmission by the second communication system are performed in parallel. Every time when it is determined that transmission by the first communication system and transmission by the second communication system are performed in parallel, the control unit controls to perform that the upper limit power value of at least one of amplifiers is reduced to be lower than an upper limit power value at the time of the corresponding determination. If the determination result changes from the state, in which transmission by both of the communication systems are performed in parallel, to the state, in which transmission by both of the communication systems are not performed in parallel, the control unit stops the second control, and performs the first control, in which the first amplifier is controlled to perform amplification within the range equal to or less than the first upper limit power value and the second amplifier is controlled to perform amplification within the range equal to or less than the second upper limit power value.

According to this portable communication terminal, in the case where transmission by the first communication system and transmission by the second communication system are performed in parallel, the upper limit power value of at least one amplifier is gradually reduced. Therefore, it is possible to maintain the transmission by each communication system as possible while prioritizing suppression of a rise in the temperature of the portable communication terminal.

In the case where the portable communication terminal changes from a state, in which transmission by both of the communication systems are performed in parallel, to a state, in which transmission by both of the communication systems are performed in parallel, the portable communication terminal returns the upper limit power value of each amplifier to the upper limit power value of the case where only transmission by a communication system corresponding to each amplifier is performed.

Therefore, according to this portable communication terminal, after the portable communication terminal becomes the state in which transmission by the both communication systems are not performed in parallel, even if the communication situation becomes bad, it is possible to improve the possibility of maintaining the current transmission.

(12) The first amplifier and a second amplifier of the portable communication terminal according to this disclosure correspond to, for example, the amplifiers 106a and 106b of the portable phone according to each embodiment, the control unit of the portable communication terminal according to this disclosure corresponds to, for example, the control unit 111, 202, or 301 according to each embodiment, and the measuring unit of the portable communication terminal according to this disclosure corresponds to, for example, the measuring unit 201 according to the second or third embodiment.

Further, the first transmitting unit of the portable communication terminal according to this disclosure corresponds to, for example, the storage unit 101a, the communication control unit 102a, the baseband unit 103a, the wireless unit 104a, the filter 105a, the amplifier 106a, the isolator 107a, the duplexer 108a, and the antenna 109a of the portable phone according to each embodiment.

Furthermore, the second transmitting unit of the portable communication terminal according to this disclosure corresponds to, for example, the storage unit 101b, the communication control unit 102b, the baseband unit 103b, the wireless unit 104b, the filter 105b, the amplifier 106b, the isolator 107b, the duplexer 108b, and the antenna 109b of the portable phone according to each embodiment.

The portable communication terminal according to this disclosure is usable to suppress a rise in temperature of a portable communication terminal having a plurality of amplifiers for power amplification on transmission signals.

What is claimed is:

1. A portable communication terminal comprising:
a first amplifier configured to amplify a transmission signal of a first communication system;
a second amplifier configured to amplify a transmission signal of a second communication system; and
a control unit configured to perform a first control, in which the first amplifier is controlled to perform amplification within a range equal to or less than a first upper limit power value, and in which the second amplifier is controlled to perform amplification within a range equal to or less than a second upper limit power value, in accordance with a communication situation,
wherein, when transmission by the first communication system and transmission by the second communication system are performed in parallel, the control unit performs a second control of performing at least one of a first amplification and a second amplification,
wherein, in the first amplification, the first amplifier performs amplification within a range equal to or less than a third upper limit power value that is less than the first upper limit power value; and
wherein, in the second amplification, the second amplifier performs amplification within a range equal to or less than a fourth upper limit power value that is less than the second upper limit power value.

2. The portable communication terminal according to claim 1,
wherein, in a case where the first amplifier performs amplification within a range equal to or greater than a predetermined first reference power value, the control unit controls the second amplifier to perform the amplification within the range equal to or less than the fourth upper limit power value.

3. The portable communication terminal according to claim 1, further comprising
a measuring unit configured to measure a temperature,
wherein, in a case where a temperature measured by the measuring unit is equal to or higher than a threshold value, the control unit performs the second control.

4. The portable communication terminal according to claim 3,
wherein the control unit repeatedly determines whether the temperature measured by the measuring unit is equal to or higher than the threshold value, and
wherein, every time when it is determined that the measured temperature is equal to or higher than the threshold value, the control unit controls to perform that the upper limit power value of at least one amplifier is reduced to be less than an upper limit power value at the time of the corresponding determination.

5. The portable communication terminal according to claim 4,
wherein, in a case where the determination result changes from the state where the temperature measured by the measuring unit is equal to or higher than the threshold value to a state where the measured temperature is lower than the threshold value, the control unit stops the second control and then performs the first control, in which the first amplifier is controlled to perform the amplification within the range equal to or less than the first upper limit power value and the second amplifier is controlled to perform the amplification within the range equal to or less than the second upper limit power value.

6. The portable communication terminal according to claim 1,
wherein the control unit specifies a lower-priority amplifier as a target amplifier for the control, based on a predetermined priority of the respective communication systems.

7. The portable communication terminal according to claim 6, further comprising:
a measuring unit configured to measure a temperature;
a first transmitting unit that includes the first amplifier and transmits a signal amplified by the first amplifier by the first communication system; and
a second transmitting unit that includes the second amplifier and transmits a signal amplified by the second amplifier by the second communication system,
wherein, after the control unit performs the second control, in a case where the temperature measured by the measuring unit is equal to or higher than a threshold value, the control unit stops the transmission of the specified target amplifier.

8. The portable communication terminal according to claim 1,
wherein, when transmission by the first communication system and transmission by the second communication system are performed in parallel, the control unit controls the first amplifier to perform amplification within the range equal to or less than the third upper limit power value, and controls the second amplifier to perform amplification within the range equal to or less than the fourth upper limit power value.

9. The portable communication terminal according to claim 1,
wherein the control unit repeatedly determines whether transmission by the first communication system and transmission by the second communication system are performed in parallel,
wherein, every time when it is determined that transmission by the first communication system and transmission by the second communication system are performed in parallel, the control unit controls to perform that the upper limit power value of at least one of amplifiers is reduced to be lower than an upper limit power value at the time of the corresponding determination, and
wherein, if the determination result changes from the state, in which transmission by both of the communication systems are performed in parallel, to the state, in which transmission by both of the communication systems are not performed in parallel, the control unit stops the second control, and performs the first control, in which the first amplifier is controlled to perform amplification within the range equal to or less than the first upper limit power value and the second amplifier is controlled to perform amplification within the range equal to or less than the second upper limit power value.

10. A method of power amplification control in a portable communication terminal including a first amplifier configured to amplify a transmission signal of a first communication system, and a second amplifier configured to amplify a transmission signal of a second communication system, the method comprising:
- controlling the first amplifier to perform amplification within a range equal to or less than a first upper limit power value, when transmission by the first communication system is performed and transmission by the second communication system is not performed;
- controlling the second amplifier to perform amplification within a range equal to or less than a second upper limit power value, when transmission by the second communication system is performed and transmission by the first communication system is not performed; and
- when transmission by the first communication system and transmission by the second communication system are performed in parallel, performing a control of performing at least one of a first amplification and a second amplification, wherein, in the first amplification, the first amplifier performs amplification within a range equal to or less than a third upper limit power value that is less than the first upper limit power value, and wherein, in the second amplification, the second amplifier performs amplification within a range equal to or less than a fourth upper limit power value that is less than the second upper limit power value.

11. A non-transitory computer-readable medium having instructions to control a computer to perform a method of image forming control, the method comprising:
- controlling the first amplifier to perform amplification within a range equal to or less than a first upper limit power value, when transmission by the first communication system is performed and transmission by the second communication system is not performed;
- controlling the second amplifier to perform amplification within a range equal to or less than a second upper limit power value, when transmission by the second communication system is performed and transmission by the first communication system is not performed; and
- when transmission by the first communication system and transmission by the second communication system are performed in parallel, performing a control of performing at least one of a first amplification and a second amplification, wherein, in the first amplification, the first amplifier performs amplification within a range equal to or less than a third upper limit power value that is less than the first upper limit power value, and wherein, in the second amplification, the second amplifier performs amplification within a range equal to or less than a fourth upper limit power value that is less than the second upper limit power value.

* * * * *